United States Patent
Shen et al.

(10) Patent No.: US 10,156,784 B2
(45) Date of Patent: Dec. 18, 2018

(54) SYSTEMS AND METHODS OF EUV MASK CLEANING

(71) Applicant: Taiwan Semiconductor Manufacturing Company, Ltd., Hsin-Chu (TW)

(72) Inventors: Ching-Wei Shen, Hsinchu (TW); Chi-Lun Lu, Hsinchu (TW); Kuan-Wen Lin, Taichung (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/888,421

(22) Filed: Feb. 5, 2018

(65) Prior Publication Data
US 2018/0157168 A1 Jun. 7, 2018

Related U.S. Application Data

(62) Division of application No. 14/811,919, filed on Jul. 29, 2015, now Pat. No. 9,885,952.

(51) Int. Cl.
*G03F 1/82* (2012.01)
*B08B 3/12* (2006.01)

(52) U.S. Cl.
CPC . *G03F 1/82* (2013.01); *B08B 3/12* (2013.01)

(58) Field of Classification Search
CPC .................................. G03F 1/82; B08B 3/12
See application file for complete search history.

(56) References Cited

U.S. PATENT DOCUMENTS

| | | | |
|---|---|---|---|
| 6,497,240 B1 | 12/2002 | Kobayashi et al. |
| 7,682,457 B2 | 3/2010 | Li et al. |
| 8,268,086 B2 | 9/2012 | Chao |
| 8,628,897 B1 | 1/2014 | Lu et al. |
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,722,286 B2 | 5/2014 | Yu et al. |
| 8,753,788 B1 | 6/2014 | Yu et al. |
| 8,764,995 B2 | 7/2014 | Chang et al. |
| 8,765,330 B2 | 7/2014 | Shih et al. |

(Continued)

FOREIGN PATENT DOCUMENTS

| | | |
|---|---|---|
| JP | 6-255091 | 9/1994 |
| JP | 2010-027816 | 4/2010 |

OTHER PUBLICATIONS

Taiwan Office Action dated Apr. 15, 2016 in Patent Application No. 104139348.

(Continued)

*Primary Examiner* — Stewart A Fraser
(74) *Attorney, Agent, or Firm* — Haynes and Boone, LLP

(57) ABSTRACT

A method includes directing an acoustically agitated fluid stream at a first surface of a substrate to cause the substrate to vibrate mechanically thereby dislodging contaminant particles on the substrate. The first surface of the substrate is opposite a second surface of the substrate. The second surface of the substrate includes a pattern. An amplitude of the acoustically agitated fluid stream is configured to produce an acoustic response along an entirety of the second surface.

20 Claims, 5 Drawing Sheets

(56) References Cited

U.S. PATENT DOCUMENTS

| | | |
|---|---|---|
| 8,765,582 B2 | 7/2014 | Hsu et al. |
| 8,785,084 B2 | 7/2014 | Lu et al. |
| 8,828,625 B2 | 9/2014 | Lu et al. |
| 8,841,047 B2 | 9/2014 | Yu et al. |
| 8,877,409 B2 | 11/2014 | Hsu et al. |
| 2005/0274397 A1 | 12/2005 | Chao |
| 2006/0027248 A1* | 2/2006 | Lewis ................. B08B 3/12 134/1 |
| 2007/0068558 A1* | 3/2007 | Papanu ............... G03F 1/82 134/29 |
| 2009/0090381 A1 | 4/2009 | Li et al. |
| 2011/0290277 A1* | 12/2011 | Wang ............. H01L 21/67051 134/1.3 |
| 2012/0097195 A1* | 4/2012 | Wang ................. B08B 3/12 134/34 |
| 2013/0206165 A1* | 8/2013 | Busnaina ............ B08B 3/12 134/1.3 |
| 2013/0340838 A1 | 12/2013 | Rastegar |
| 2015/0158056 A1 | 6/2015 | Rastegar |
| 2017/0031241 A1 | 2/2017 | Shen et al. |

OTHER PUBLICATIONS

Korean Office Action dated Sep. 26, 2016 in Patent Application No. 10-2015-0162014.

* cited by examiner

SYSTEMS AND METHODS OF EUV MASK CLEANING

PRIORITY

This is a divisional of U.S. patent application Ser. No. 14/811,919 filed on Jul. 29, 2015, the entire disclosure of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows.

One lithography technique is extreme ultraviolet lithography (EUVL). The EUVL employs a photomask to be exposed in the extreme ultraviolet (EUV) region so as to form a pattern on a substrate. Generally, a photomask employed in the EUVL is referred to as a EUV photomask. Light in the EUV region has a wavelength in the range from about 1 nm to about 100 nm.

While existing lithography techniques have been generally adequate for their intended purposes, they have not been entirely satisfactory in every aspect. For example, the reuse of EUV photomasks in EUVL processes has given rise to issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
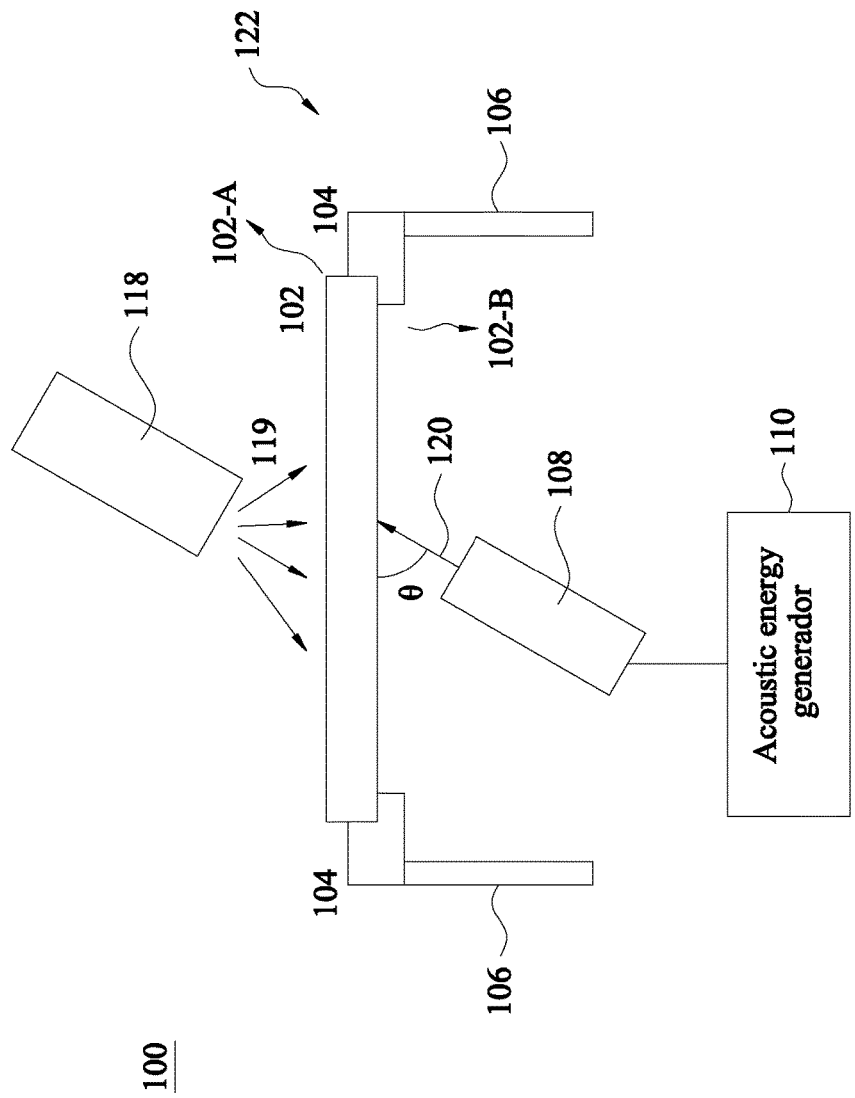
FIG. 1 illustrates a system to clean a photomask in accordance with embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a simplified view of a system 100 that used to clean a photomask 102, constructed in accordance with some embodiments. In a specific embodiment discussed below, the photomask 102 is an extreme ultraviolet (EUV) photomask. Details of the structure of an EUV photomask will be provided in the example 200 with respect to FIG. 2. However, the system 100 may be used to clean other items such as substrates and/or wafers, and still fall within the scope of the present disclosure.

Referring to FIG. 1, the system 100 includes a bracket 122 that is configured to support and rotate the photomask 102. The bracket 122 further includes a support finger 104, and a support post 106. In the illustrated embodiments, although the support finger 104 is shown to support the photomask 102 (i.e., in contact with only back side of the photomask 102-B), in some alternative embodiments, the finger 104 may serve as a clamp of the photomask 102. The front side 102-F of the photomask 102 includes a pattern of features. Such a pattern of features may be associated with a semiconductor device or portion thereof, such as a plurality of gate structures (e.g., polysilicon features, metal gate features, etc), source/drain regions, interconnect lines or vias, dummy features, and/or other suitable patterns. The back side 102-B of the photomask 102 does not include a pattern of feature. As shown, back side 102-B of the photomask 102 is opposite the front side 102-F of the photomask 102.

Referring still to FIG. 1, the system 100 includes a nozzle 118 directed (or adjacent) at the front side 102-F of the photomask 102, a nozzle 108 directed (or adjacent) at the back side 102-B of the photomask 102, and an acoustic energy generator 110 coupled to the nozzle 108 at the back side 102-B of the photomask 102. In some embodiments, a spray 119 (e.g., a chemical solution) is dispensed from the nozzle 118 and is incident the front side 102-F of the photomask 102. Similarly, a fluid stream (or fluid path) 120 is dispensed from the nozzle 108 incident the back side 102-B of the photomask 102.

In some specific embodiments discussed below, the fluid stream 120 dispensed from nozzle 108 is incident the back side of the photomask 102 with an angle, "θ". Details of the operation of the acoustic energy generator 110 and the back side nozzle 108 will be provided below and the flow chart with respect to FIG. 3.

Extreme ultraviolet lithography (EUVL) is a promising patterning technology for very small semiconductor technology nodes, such as 14 nm, and beyond. EUVL is very similar to optical lithography in that it needs a photomask to print wafers, except that it employs light in the EUV region that ranges from about 1 nm to about 100 nm. Most commonly, light used in the EUVL process is about 13.5 nm.

Figure 2:
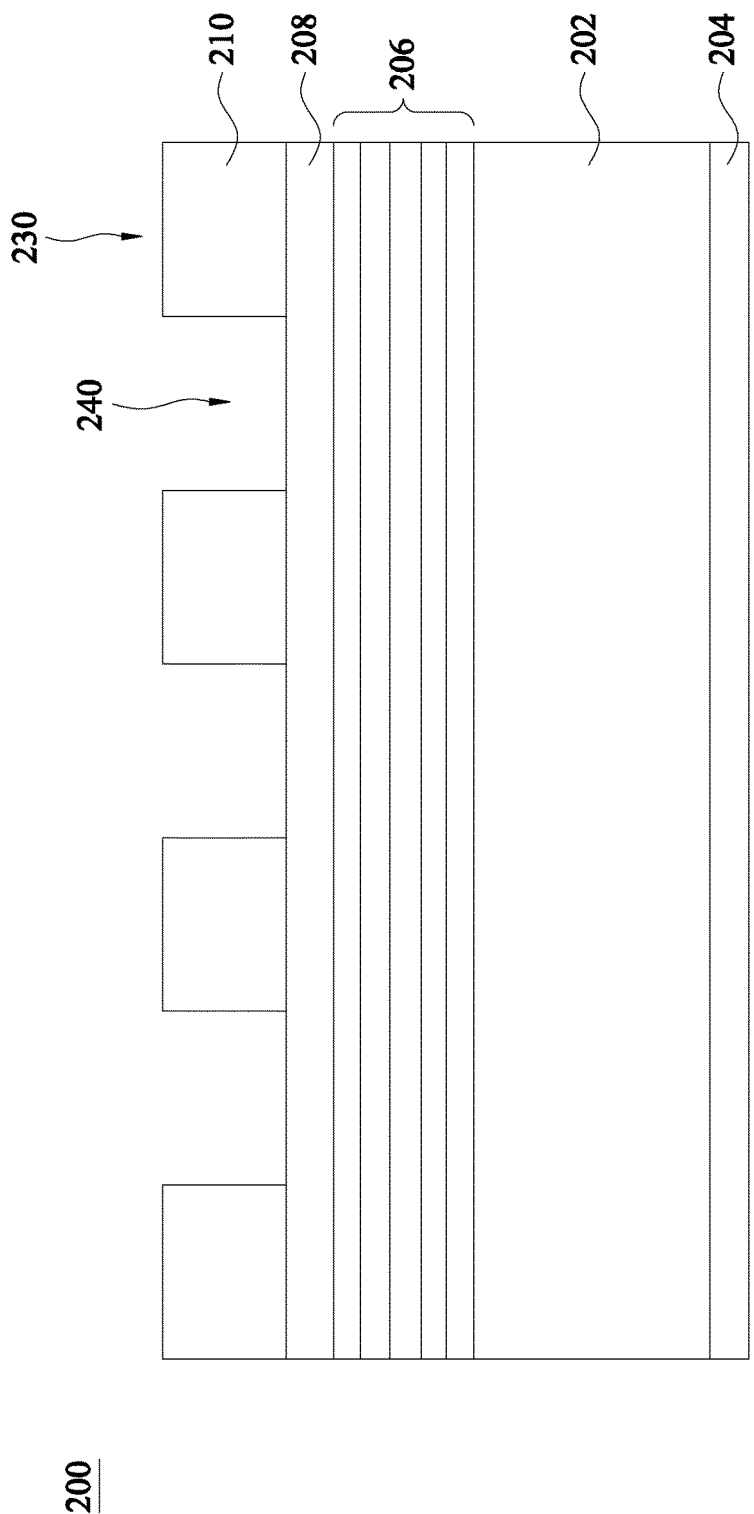
FIG. 2 illustrates an example of an extreme ultra violet (EUV) photomask in accordance with some embodiments of the present disclosure.

FIG. 2 shows an embodiment of an EUV photomask 200 used in EUVL in accordance with various embodiments. In general, a variety of photomasks may be used in the EUVL, and the disclosed method to clean such photomasks still falls within the scope of the present disclosure. For example, the EUV photomasks may include binary intensity photomasks (BIM) and phase-shifting photomasks (PSM). An example of BIM includes an almost totally absorptive region (also referred to as a dark region) and a reflective region. In the opaque region, an absorber is present and incident light is almost fully absorbed by the absorber. In the reflective region, the absorber is removed and incident light is reflected by a multilayer (ML). A PSM includes an absorptive region and a reflective region. The phase difference (generally 180°) between a portion of a light reflected from the absorptive region and a portion of the light reflected from the reflective region enhances resolution and image quality. The PSM can be an attenuated PSM (AttPSM) or an alternating PSM (AltPSM). An AttPSM usually has a reflectivity of 2%-15% from its absorber, while an AltPSM usually has a reflectivity of larger than 50% from its absorber.

Referring still to FIG. 2, the photomask 200 includes a mask substrate 202 made of low thermal expansion material (LTEM). The LTEM material may include $TiO_2$ doped $SiO_2$, and/or other low thermal expansion materials. The LTEM substrate 202 serves to minimize image distortion due to mask heating. In an embodiment, the LTEM substrate includes materials with a low defect level and a smooth surface. In addition, a conductive layer 204 may be formed on the backside surface of the LTEM substrate 202 (as shown in FIG. 2) for the electrostatic chucking purpose. In an embodiment, the conductive layer 204 includes chromium nitride (CrN), or other suitable conductive material.

The photomask 200 includes a reflective multilayer (ML) 206 disposed over the mask substrate 202 on the front surface (i.e. opposite the surface on which the conductive layer 204 is formed). In accordance with the Fresnel equations, light reflection occurs when light propagates across an interface between two materials of different refractive indices. The greater the difference between the refractive indices of layers, the higher the intensity of the reflected light becomes as it propagates across the layers. To increase the intensity of the reflected light, in some embodiments, a multilayer of alternating materials may be used to increase the number of interfaces so as to cause the light reflected from each of the different interfaces to interfere constructively. The ML 206 includes a plurality of film pairs, such as molybdenum-silicon (Mo/Si) film pairs (e.g., a layer of molybdenum above or below a layer of silicon in each film pair). Alternatively, the ML 206 may include molybdenum-beryllium (Mo/Be) film pairs, or any suitable material that is highly reflective at EUV wavelengths. The thickness of each layer of the ML 206 depends on the EUV wavelength and the incident angle. The thickness of the ML 206 is adjusted to achieve a maximum constructive interference of the EUV light reflected at each interface and a minimum absorption of the EUV light by the ML 206. The ML 206 may be selected such that it provides a high reflectivity to a selected radiation type and/or wavelength. In a specific example, the number of the film pairs in the ML 206 may range from 20 to 80, however any number of film pairs may be used. In one example, the ML 206 includes forty pairs of layers of Mo/Si. In such an example, each Mo/Si film pair has a thickness of about 7 nm and ML 206 has a total thickness of 280 nm. In this case, a reflectivity of about 70% is achieved.

The photomask 200 includes a protection layer 208 formed over the ML 206 for one or more functions. In one example, the protection layer 208 functions as an etch stop layer in a patterning process or other operations, such as repairing or cleaning. In another example, the protection layer functions to prevent oxidation of the ML 206. The protection layer 208 may include a single film or multiple films to achieve the intended functions. In some embodiments, the protection layer 208 includes a buffer layer disposed over the ML 206 and a capping layer disposed over the buffer layer. The buffer layer is designed to prevent oxidation of the ML 206. In some examples, the buffer layer may include silicon with about 4-7 nm thickness. In other examples, a low temperature deposition process may be chosen to form the buffer layer to prevent inter-diffusion of the ML 206. With regard to the capping layer formed over the buffer layer, such capping layer may be formed over the buffer layer to act as an etching stop layer in a patterning or repairing/cleaning process of an absorption layer. The capping layer has different etching characteristics from the absorption layer. In accordance with various illustrative embodiments, the capping layer includes ruthenium (Ru), Ru compounds such as RuB, RuSi, chromium (Cr), Cr oxide, and Cr nitride. A low temperature deposition process is often chosen for the capping layer to prevent inter-diffusion of the ML 206.

The photomask 200 also includes an absorption layer 210 is formed over the protection layer 208. In an embodiment, the absorption layer 210 absorbs radiation in the EUV wavelength range projected onto a patterned mask. The absorption layer 210 includes multiple film layers with each film containing chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, molybdenum, other suitable materials, and/or mixture of some of the above.

Still referring to FIG. 2, in some embodiments, the absorption layer 210 may be patterned according to an IC layout pattern (or simply IC pattern). For example, as shown in FIG. 2, the absorption layer 210 is patterned to define opaque regions 230 and reflective regions 240. In the opaque region 230, the absorption layer 210 remains on the photomask 200 while in the reflective region 240, the absorption layer 210 is removed.

Although the environment in which the EUVL process is performed is kept relatively clean, there are still contaminants formed on the front/back sides of the photomask. For example, some contaminant organics (e.g., residual photoresist stripes) may be formed on the front side of the photomask. Such contaminant organics are generally distributed in size of about 50 to 100 nanometers, and frequently distributed within a pattern. On the other hand, some relatively large contaminant particles may be formed over the back side of a photomask. The size of the contaminant particles on the back side of a photomask may be about 3 to 50 micrometers. Regardless of which kind of contaminants formed on a photomask, those contaminants may otherwise interfere with the patterning process if they get on the photomask. For example, the presence of contaminant particles may lead to defocus or out-of-focus issues. Therefore, a cleaning process may be needed to dislodge such contaminants after each lithography process. Conventionally, due to the different sizes of the contaminants formed on each side of a photomask, at least two or more cleaning processes may be needed to dislodge the contaminants formed on both sides of the photomask. In an example, a spray with a first intensity may be used to clean the contaminant organics on the front side of the photomask, subsequently a spray with a second intensity may be used to clean the contaminant particles on the back side of the photomask. As mentioned above, since the different sizes of the contaminants on each side of the photomask, the first intensity and second intensity may be different. Moreover, since conventional cleaning systems may only include one nozzle, a nozzle configured to disperse different intensities of spray and a flipping process may be needed. Such flipping process may cause not only additional contaminants formed on the front side of the photomask during the cleaning of the back side of the photomask, but also result in extra time consumption to clean the photomask.

Thus, the present disclosure provides systems and methods to provide an in-situ cleaning process on both sides of a photomask. That is, even though there may be different sizes of contaminants formed on each side of a photomask, the disclosed embodiment dislodges the contaminants formed on both sides of a photomask simultaneously.

Figure 3:
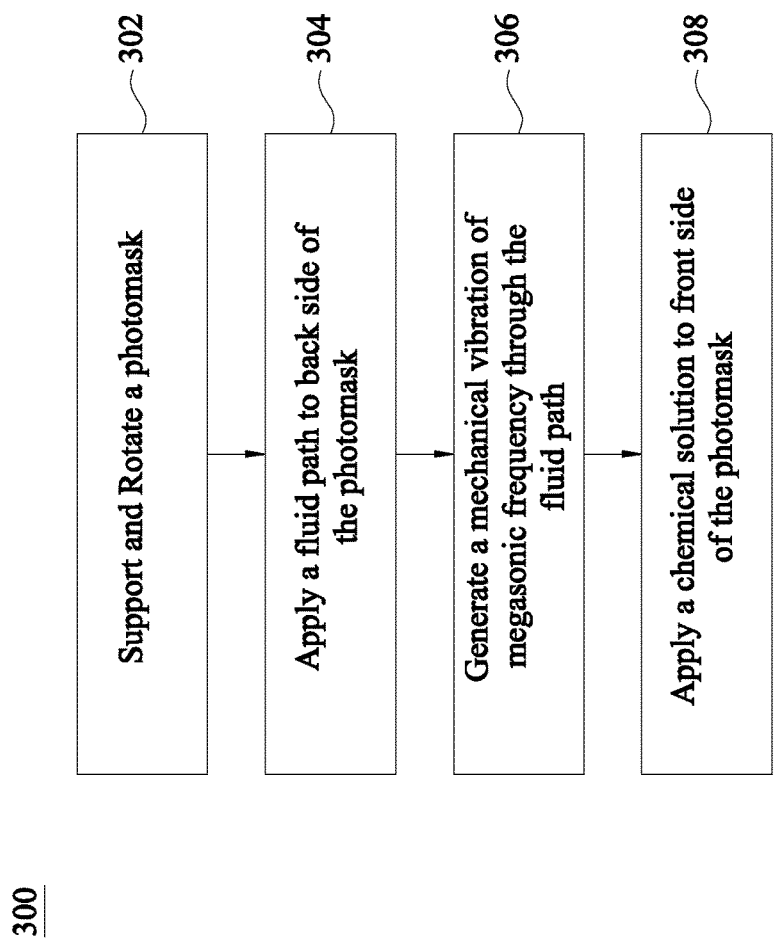
FIG. 3 illustrates a method of using the system of FIG. 1 to clean a photomask in accordance with some embodiments of the present disclosure.

Referring now to FIG. 3, a flow chart is shown to illustrate a method 300 of cleaning a photomask in accordance with various embodiments. The method 300 is described in conjunction with the system 100 of FIG. 1 and the photomask 102 of FIG. 1 and/or the photomask 200 of FIG. 2. Although in the illustrative embodiment of FIG. 3, the method 300 is directed to cleaning a EUV photomask, the presently disclosed method 300 may be applied to clean a variety of types of photomasks and/or wafers.

The method 300 starts in block 302 with supporting and rotating the photomask 102/200. As described above, the bracket 122 may be used to support and rotate the photomask 102/200. In some embodiments, a rotation speed of the photomask 102/200 may range from 0 radius per minute (rpm) to 500 rpm. That is, the photomask 102/200 may be stationary (i.e., 0 rpm) or may move horizontally in a spinning motion during following blocks 304~308.

The method 300 continues in block 304 in which the fluid stream 120 is applied, though the nozzle 108, onto the back side of the photomask (e.g., 102-B). The fluid stream is composed of cleaning fluid (a first chemical solution) that includes at least one of: ozone water, teramethylammonium hydroxide (TMAH), carbon dioxide ($CO_2$) dissolved in water, hydrogen ($H_2$) dissolved in water, and standard clean 1 (SC1). More specifically, the incident angle "ϑ", as described above in FIG. 1, may range from about 60 degrees to about 90 degrees.

Subsequently, the method 300 continues in block 306 where the acoustic energy generator 110 generates a mechanical vibration to the photomask 102/200 through the fluid stream 120. That is, the acoustic energy generator 110, coupled to the nozzle 108, is configured to generate an acoustic wave, then propagate the generated acoustic wave through the fluid stream 120 to form an acoustically agitated fluid stream which causes the fluid stream 120 applied to the back side of the photomask 102/200 to generate a mechanical vibration to the photomask 102/200 via the acoustically agitated fluid stream. Such an acoustically agitated fluid stream forms microbubble(s) mechanically vibrating in a frequency within the fluid stream 120 and the vibrating microbubbles may be used to dislodge the contaminants formed on the back side of the photomask 102/200. Generally, such a microbubble may be sized in a diameter of about 3 micrometers.

Still referring to block 306 of the method 300, in accordance with various embodiments, the frequency of the mechanical vibration generated by the acoustic energy generator 110 may range from about 1 megahertz to about 3 megahertz. Such frequency is generally referred to megasonic frequency. Alternatively or additionally, a variety of frequencies may be used in the disclosed system 100 to clean a photomask, for example, an ultrasonic wave (i.e., frequency between about 20 kilohertz to about 400 kilohertz) may be generated by the acoustic energy generator 110.

The method 300 continues in block 308 in which the nozzle 118 disperses the spray 119 onto the front side of the photomask 200. In some embodiments, the spray 119 may include a second chemical solution that is different than the first chemical solution discussed above. In other embodiments, the first and second chemical solutions are the same. The second chemical solution may include sulfide acid, hydrogen peroxide, or a combination (i.e., SPM) thereof. In some other embodiments, equipment to generate plasma, aqueous ozone ($DIO_3$), and/or acoustic wave (e.g., megasonic wave) may also be combined with the nozzle 118 to remove the contaminants (e.g., photoresist strips) formed on the front side of the photomask 102/200. In an example of using the acoustic wave, an acoustic energy generator (different from or the same as the acoustic energy generator 110) may be thus coupled to the nozzle 118 so as to produce an acoustically agitated fluid stream.

It is understood that additional blocks/processes may be performed before, during, and/or after the blocks 302-308, and/or some described blocks may be combined. For example, blocks 304-308 may be combined as a single step. That is, during the cleaning process of the photomask 102/200, the fluid stream 120 vibrating in megasonic frequency and the spray 119 is respectively applied to the back side and the front side of the photomask 102/200 at the same time. It is also noted that the photomask is not flipped during blocks 302-308 in some embodiments. The lack of photomask flipping prevents and limits previously removed contaminants from reattaching the photomask during the cleaning process.

Figure 4A:
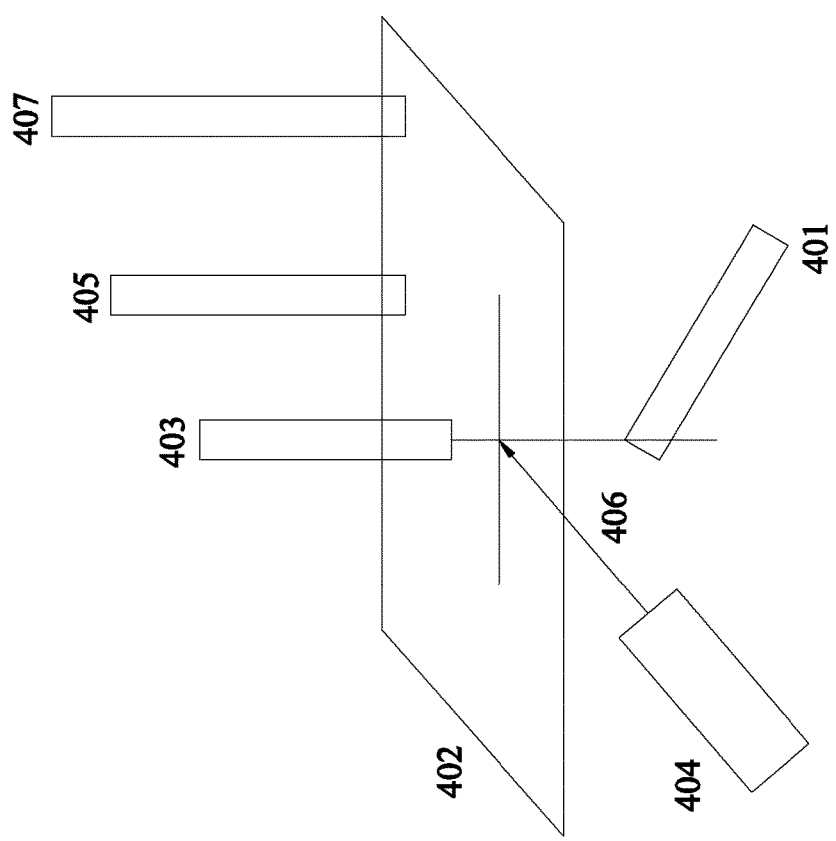
FIGS. 4A-4B illustrate examples of sensed acoustic pressure on multiple points of the photomask in response to an acoustic energy generator in accordance with some embodiments of the present disclosure.
Figure 4B:
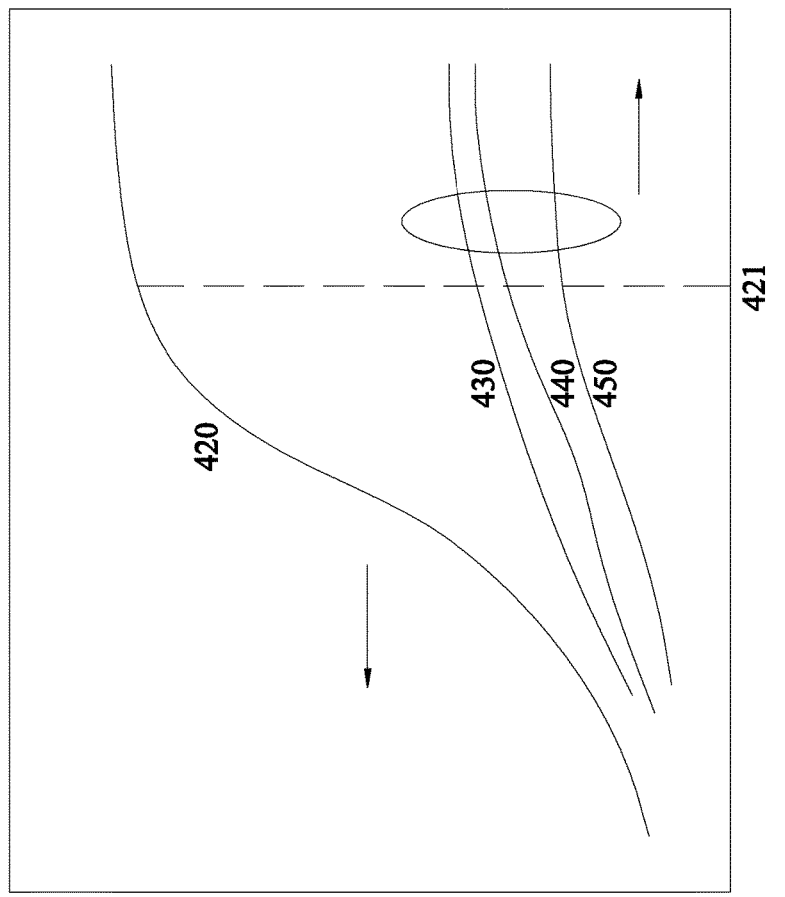

FIGS. 4A and 4B show an example of acoustic pressure sensed in multiple points on a photomask in accordance with various embodiments. As described above, as an acoustically agitated fluid stream is applied on a surface of a photomask, microbubbles are induced in the stream of fluid so as to dislodge contaminants on the applied surface. Generally, the intensity and/or the effect of the acoustically agitated fluid stream on the surface may be quantified by acoustic pressure sensed on the surface. In FIG. 4A, a nozzle 404 (may be considered as corresponding to nozzles 108 and/or 118 discussed above) generates an acoustically agitated fluid stream 406 on a back side of a photomask 402 (may be considered as corresponding to photomasks 102/200 discussed above). While the acoustically agitated fluid stream 406 is applied onto the photomask 402, sensors 401, 403, 405, and 407 are deployed at different points on the photomask 402 to monitor the acoustic pressure. In the illustrated embodiment of FIG. 4A, sensor 401 is placed at the back side of the photomask and at the point of the photomask to which the acoustically agitated fluid stream 406 is incident; sensor 403 is also placed at the same point of the photomask to which the acoustically agitated fluid stream 406 is incident but placed at the front side of the photomask; sensors 405 and 407 are both placed at the front side of the photomask and respectively displaced from the point of the photomask to which the acoustically agitated fluid stream 406 is incident with a horizontal distance. FIG. 4B shows an example of sensed acoustic pressure monitored by each of the sensors 401, 403, 405, and 407. Line 420 corresponds to a relationship between the pressure monitored by the sensor 401 and the acoustic power provided by the acoustic energy generator 110. Line 430 corresponds to a relationship between the pressure monitored by the sensor 403 and the acoustic power provided by the acoustic energy generator 110. Line 440 corresponds to a relationship between the pressure monitored by the sensor 405 and the acoustic power provided by the acoustic energy generator 110. Line 450 corresponds to a relationship between the pressure monitored by the sensor 407 and the acoustic power provided by the acoustic energy generator 110.

As illustrated in FIG. 4B, line 420 shows a relatively higher amount of acoustic pressure than lines 430-450, which means that although the vibration of the photomask 402 is induced by the acoustically agitated fluid stream that is incident from the back side of the photomask 402, the photomask as a whole still vibrates in a similar fashion. Moreover, as dotted line 421 in FIG. 4B indicates, the acoustic power monitored by the sensor 401 saturates at the right side of the dotted line 421. This implies that once the megasonic power provided by the acoustic energy generator exceeds a threshold (e.g., 421), the acoustic pressure may not increase accordingly.

Based on the above discussions, it can be seen that the present disclosure offers various advantages. It is understood, however, that not all advantages are necessarily discussed herein, and other embodiments may offer different advantages, and that no particular advantage is required for all embodiments.

One of the advantages is that the present disclosure offers a novel way of cleaning a photomask. As discussed above, by using the presently disclosed method and system, the front side and the back side of the photomask may be cleaned at the same time while using two different approaches to each of the sides of the photomask. In some embodiments, since, in general, contaminants formed on the back side of the photomask may have relatively larger size than those formed on the front side, using the disclosed method and system may perform an "in-situ" cleaning process. Moreover, since each of the front side and the back side is cleaned individually, no flipping process is needed, which may advantageously avoid any cross-contaminants being formed during such a flipping process.

The present disclosure provides a system for cleaning a photomask in accordance with some embodiments. The system includes a bracket that is configured to support the photomask and is located at a first side of the photomask; an acoustic energy generator configured to generate acoustic energy, wherein the acoustic energy includes mechanical vibrations of a megasonic frequency and wavelength; and a fluid dispenser coupled to the acoustic energy generator such that the acoustic energy generated by the acoustic energy generator is received by the fluid dispenser to generate an acoustically agitated fluid stream directed at a second side of the photomask, wherein the first side of the photomask is opposite a second side of the photomask, and wherein the first side includes a pattern.

The present disclosure provides a system of cleaning a substrate in accordance with some embodiments. The system includes a bracket that is configured to support and horizontally rotate a substrate having a top surface and an opposing bottom surface, wherein the top surface includes a pattern; a first nozzle, located adjacent the bottom surface of the substrate, configured to apply a fluid stream that vibrates at a megasonic frequency onto the bottom surface of the substrate thereby causing the substrate to vibrate mechanically at the megasonic frequency; and a second nozzle, located at a second side of the substrate, configured to discharge a chemical solution onto the top surface of the substrate.

The present disclosure provides a method of cleaning a substrate in accordance with various embodiments. The method includes directing an acoustically agitated fluid stream at a first surface of a substrate to cause the substrate to vibrate mechanically at a megasonic frequency thereby dislodging contaminant particles on the first surface of the substrate, wherein the first surface of the substrate is opposite a second surface of the substrate, wherein the second surface of the substrate includes a pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   directing an acoustically agitated fluid stream at a first surface of a substrate to cause the substrate to vibrate mechanically thereby dislodging contaminant particles on the substrate,
   wherein the first surface of the substrate is opposite a second surface of the substrate, wherein the second surface of the substrate includes a pattern, wherein an amplitude of the acoustically agitated fluid stream is configured to produce an acoustic response along an entirety of the second surface.

2. The method of claim 1, wherein the acoustically agitated fluid stream includes at least one of: ozone water, tetramethylammonium hydroxide (TMAH), carbon dioxide ($CO_2$) dissolved in water, hydrogen ($H_2$) dissolved in water, and standard clean 1 (SC1).

3. The method of claim 1, further comprising:
   while directing the acoustically agitated fluid stream at the first surface of the substrate, simultaneously applying a chemical solution onto the second surface of the substrate.

4. The method of claim 3, wherein the chemical solution is different from the acoustically agitated fluid stream.

5. The method of claim 3, wherein the chemical solution is also acoustically agitated.

6. The method of claim 1, further comprising:
   while directing the acoustically agitated fluid stream at the first surface of the substrate, simultaneously rotating the substrate.

7. The method of claim 1, wherein the acoustically agitated fluid stream is not retained against the first surface of the substrate.

8. The method of claim 1, wherein the directing causes the substrate to vibrate mechanically at a frequency ranging between about 1 megahertz (MHz) and about 3 MHz.

9. The method of claim 1, wherein the substrate includes an extreme ultraviolet (EUV) photolithography mask.

10. The method of claim 1, wherein the directing the acoustically agitated fluid stream at the first surface of the substrate includes directing the acoustically agitated fluid stream at an angle between about 60 degrees and about 90 degrees relative to the first surface of the substrate.

11. A method, comprising:
supporting a substrate;
directing an acoustically agitated fluid stream at a first side of the substrate to cause the substrate to vibrate mechanically at a megasonic frequency to dislodge contaminant particles on the first side of the substrate; and
rotating the substrate while directing the acoustically agitated fluid stream at the first side of the substrate,
wherein the first side of the substrate is opposite a second side of the substrate, wherein the second side of the substrate includes a pattern associated with a semiconductor device, wherein an amplitude of vibration in the acoustically agitated fluid stream is greater than or equal to a saturation threshold with respect to vibration of the second side, and wherein the acoustically agitated fluid stream is not retained against the first side of the substrate.

12. The method of claim 11, wherein the acoustically agitated fluid stream includes microbubbles mechanically vibrating at the megasonic frequency.

13. The method of claim 11, further comprising:
while directing the acoustically agitated fluid stream at the first side of the substrate, simultaneously applying a chemical solution onto the second side of the substrate.

14. The method of claim 11, wherein the directing of the acoustically agitated fluid stream produces an acoustic response at a periphery of the second side.

15. The method of claim 11, wherein the acoustically agitated fluid stream includes one of: ozone water, tetramethylammonium hydroxide (TMAH), carbon dioxide ($CO_2$) dissolved in water, hydrogen ($H_2$) dissolved in water, and standard clean 1 (SC1).

16. The method of claim 11, wherein the acoustically agitated fluid stream is directed at the first side of the substrate at an angle between about 60 degrees and about 90 degrees relative to the first side of the substrate.

17. A method, comprising:
directing an acoustically agitated fluid stream at a first side of a substrate to cause the substrate to vibrate mechanically to dislodge contaminant particles on the substrate; and
rotating the substrate while directing the acoustically agitated fluid stream at the first side of the substrate,
wherein the first side of the substrate is opposite a second side of the substrate, wherein the second side of the substrate includes a pattern associated with a semiconductor device, wherein the directing of the acoustically agitated fluid stream produces an acoustic response at a periphery of the second side of the substrate.

18. The method of claim 17, wherein the acoustically agitated fluid stream includes microbubbles mechanically vibrating at a megasonic frequency.

19. The method of claim 17, further comprising:
while directing the acoustically agitated fluid stream at the first side of the substrate, simultaneously applying a chemical solution onto the second side of the substrate, wherein the chemical solution is different from the acoustically agitated fluid stream.

20. The method of claim 17, wherein the acoustically agitated fluid stream is not retained against the first side of the substrate.

* * * * *